(12) United States Patent
Schlienger et al.

(10) Patent No.: US 6,837,299 B2
(45) Date of Patent: Jan. 4, 2005

(54) HEATING TO CONTROL SOLIDIFICATION OF CAST STRUCTURE

(75) Inventors: Max Eric Schlienger, Napa, CA (US); Nina Bergen French, Napa, CA (US)

(73) Assignee: Sky+Ltd., Napa, CA (US)

(*) Notice: Subject to any disclaimer, the term of this patent is extended or adjusted under 35 U.S.C. 154(b) by 0 days.

(21) Appl. No.: 10/422,172

(22) Filed: Apr. 24, 2003

(65) Prior Publication Data

US 2003/0221810 A1 Dec. 4, 2003

Related U.S. Application Data (60) Provisional application No. 60/375,720, filed on Apr. 26, 2002.

(51) Int. Cl.[7] .............. B22D 25/00; B22D 27/04
(52) U.S. Cl. .............. 164/122.2; 164/122.1; 164/338.1
(58) Field of Search .............. 164/122.1, 122.2, 164/338.1

(56) References Cited

U.S. PATENT DOCUMENTS

| | | | |
|---|---|---|---|
| 3,838,729 A | 10/1974 | Daigne et al. | 164/50 |
| 3,842,895 A | 10/1974 | Mehrabian et al. | 164/49 |
| 4,356,861 A | 11/1982 | Winter | 164/462 |
| 4,695,329 A | 9/1987 | Hayashi et al. | 148/3 |
| 4,813,470 A | 3/1989 | Chiang | 164/122.1 |
| 4,867,224 A * | 9/1989 | Wakita et al. | 164/80 |
| 4,925,636 A | 5/1990 | Hemmerdinger et al. | 422/248 |
| 4,934,446 A | 6/1990 | Winter | 164/503 |
| 5,013,393 A | 5/1991 | Schwirtlich et al. | 156/616.2 |
| 5,066,223 A * | 11/1991 | Mosch | 432/184 |
| 5,080,726 A | 1/1992 | McKannan et al. | 148/1 |
| 5,116,456 A | 5/1992 | Nestor | 156/616.1 |
| 5,182,073 A * | 1/1993 | Camacho | 266/52 |
| 5,291,940 A | 3/1994 | Borofka et al. | 164/494 |
| 5,658,506 A * | 8/1997 | White et al. | 264/28 |
| 5,743,322 A * | 4/1998 | Jackson et al. | 164/98 |
| 5,758,707 A | 6/1998 | Jung et al. | 164/4.1 |
| 6,024,792 A | 2/2000 | Kurz et al. | 117/9 |
| 6,103,402 A | 8/2000 | Marcin, Jr. et al. | 428/637 |
| 6,193,141 B1 | 2/2001 | Burke | 228/190 |
| 6,222,152 B1 | 4/2001 | Nomura et al. | 219/118 |
| 6,269,540 B1 | 8/2001 | Islam et al. | 29/889.7 |

* cited by examiner

*Primary Examiner*—Kuang Y. Lin
(74) *Attorney, Agent, or Firm*—William A. Simons; Wiggin and Dana LLP (57) ABSTRACT

A method for the production of a cast component comprising the steps of:

1) providing a molten metal mass in a casting mold and exposing the casting mold to a cooling environment thereby creating a solidification interface between molten metal regions and solidified metal regions, and
2) applying at least one focused energy source either to a portion of the filled casting mold to control a temperature gradient near the solidification interface.

14 Claims, 5 Drawing Sheets

HEATING TO CONTROL SOLIDIFICATION OF CAST STRUCTURE

CROSS-REFERENCE TO RELATED CASES

This patent application is an utility conversion of commonly owned U.S. Provisional Patent Application Ser. No. 60/375,720, entitled "FOCUSED HEATING TO CONTROL SOLIDIFICATION OF CAST STRUCTURE" that was filed on Apr. 26, 2002. This provisional application is incorporated by reference in its entirety herein.

BACKGROUND OF THE INVENTION

1. Field of the Invention

The present invention relates generally to a method and apparatus for the production of a cast component. More particularly, in one embodiment of the present invention, a focused (non-diffuse) energy source (e.g. a laser—although a laser does not necessarily need to be focused) is use to control the temperature gradient at the solidification interface during solidification of single crystal or directionally solidified castings. Another embodiment of the present invention is to control casting shrink during solidification of all types of castings (including equiaxed castings). Although one form of the invention is directed to producing single crystal or directionally solidified castings for gas turbine blades, the present invention also includes certain applications outside of that field.

2. Brief Description of Art

The performance of a gas turbine engine generally increases with an increase in the operating temperature of a high temperature working fluid flowing from a combustor. One factor recognized by gas turbine engine designers as limiting the allowable temperature of the working fluid is the capability of the engine components to not degrade when exposed to the high temperature working fluid. The components, such as blades and vanes, within the engine and downstream of the combustor are exposed to significant thermal and kinetic loading during engine operation. The repeated thermal and kinetic loading have caused mechanical failure of these engine components by creep and cracking. In recognition of the prior component failures and that the performance of these components ultimately dictate the engine performance, it has been generally accepted to make these components as single crystal or directionally solidified castings. Further, the demand for continued engine performance has resulted in the development of components having an internal network of apertures and passageways. Therefore, in modem advanced gas turbine engines many of the components are generally hollow air-cooled structures having a directionally solidified or single crystal microstructure.

Although there are well established techniques for producing directionally solidified and single crystal cast components with internal passageways and apertures there remains a need for a simpler, less expensive method and apparatus for casting these components. The present invention satisfies this and other needs in a novel and unobvious way.

BRIEF SUMMARY OF THE INVENTION

Therefore, one aspect of the present invention is directed to a method for the production of a cast component comprising the steps of:

1) providing a molten metal mass into a casting mold and exposing the casting mold to a cooling environment thereby creating a solidification interface between molten metal regions and solidified metal regions; and 2) applying at least one focused energy source to a portion of the filled casting mold to control the temperature gradient near the solidification interface.

Another aspect of the present invention is directed to a method for controlling solidification of a molten metal mass in a casting mold, comprising the steps of:

1) providing a molten metal mass into a casting mold and exposing the casting mold to a cooling environment thereby creating a solidification interface between molten metal regions and solidified metal regions;

2) applying at least one focused energy source to a portion of the filled casting mold to control the temperature gradient near the solidification interface; and 3) rastering or otherwise scanning that focused energy source across the portion of the filled mold intended to stay molten to control the order of solidification thereby controlling casting shrink, or controlling the rate of solidification thereby controlling grain structure in the final casting.

One preferred aspect of the present invention is directed to a method for producing single crystal, directionally solidified cast components, comprising the steps of:

1) introducing at least one solid metal starter seed into a casting mold, each solid starter seed used to initiate a strictly oriented, single crystal microstructure to the solidified case component being made;

2) introducing a molten quantity of the same metal into the casting mold, causing at least a portion of the metallic starter seed to melt back and to form at least one solidification interface;

3) applying at least one focused energy source to a portion of the mold close to the solidification interface; and 4) rastering or otherwise scanning at least one focused energy source across the portions of the mold intended to stay molten in a predetermined pattern thereby producing a single crystal, directionally solidified cast component.

Another preferred aspect of the present invention is directed to a method for producing single crystal, directionally solidified cast component, comprising the steps of:

1) providing a molten metal mass into a casting mold, exposing the casting mold to a cooling environment thereby creating a solidification interface between molten metal regions and solidified metal regions;

2) selectively heating at least one portion of the molten metal regions located approximately near the interface with a focused energy source to control the temperature gradient and create a single cell microstructure in that portion of the molten metal region; and 3) rastering or otherwise scanning at least one focused energy source across the portions of the filled mold intended to stay molten, thereby producing a single crystal, directionally solidified cast component.

And still another aspect of the present invention is directed to an apparatus for the production of a cast component comprising:

1) a mold capable of holding a molten metal mass that when solidified becomes a cast component; and 2) at least one focused energy source capable of directing at least one energy beam onto a predetermined portion of the filled casting mold.

DETAILED DESCRIPTION OF THE INVENTION

The term "focused" as used in the present specification and claims refers to any energy source that is directionally non-diffused in nature. Preferred focused energy sources may include lasers and microwave beams. It should be noted that the focused energy sources used herein do not require additional physical focusing means to achieve this focused nature. For example, diode lasers that by their very nature are a directional non-diffused energy source may be used.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated process and device, and such further applications of the principles of the invention as illustrated therein being contemplated as would normally occur to one skilled in the art to which the invention relates.

Figure 1:
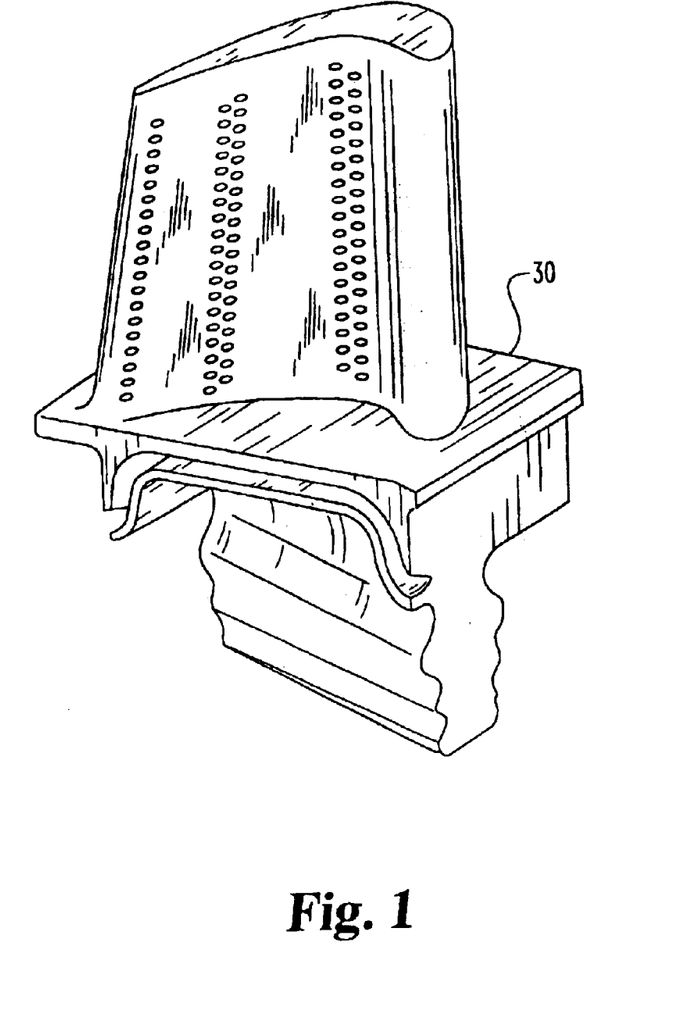
FIG. 1 is a perspective view of a gas turbine engine blade.

With reference to FIG. 1, there is illustrated a gas turbine engine blade 30. In one embodiment, the gas turbine engine blade 30 defines a single cast article having an internal flow path for the passage of cooling media. The internal cooling path can include a passageway with a plurality of heat transfer pedestals. In one embodiment, the plurality of pedestals is integrally formed between a pair of spaced walls. The present invention may be utilized to produce single piece single cast components or multipiece cast components having microstructures that are commonly categorized as equiaxed, directionally solidified or single crystal. The casting solidification systems of the present invention are suitable for producing virtually any type of cast metallic product, however in a preferred embodiment they are particularly useful for producing thin-walled single crystal structures. The illustration of the gas turbine engine blade is purely for illustrative purposes and there is no intention to limit the types of components that can be produced by the present inventions.

The present invention contemplates the casting of components from virtually any type of metallic material. As utilized herein, metallic materials will include, but are not limited to, alloys, superalloys, elemental metals, refractory metals and intermetallic materials. However, in the manufacture of gas turbine engine components the metallic materials are preferably selected from superalloy material. There are various types of superalloy materials, such as but not limited to nickel-based or cobalt-based compositions, and the manufactures of such materials are generally known to those skilled in the art. Most superalloy materials of interest are complicated mixtures of nickel, chromium, aluminum and other select elements. Other preferred materials of interest include aluminides such as titanium aluminide and nickel aluminide and suicides.

The present invention also encompasses the use of a wide variety of materials for the casting molds used herein. These materials include both transmissive mold material (i.e. incident focused energy is transmitted in whole or in part through the mold and is absorbed by the molten metal) and absorptive mold material (i.e. where the incident focused energy is absorbed by the mold material and conducted/radiated into the molten material). Also contemplated herein are materials that have both transmissive and absorbent properties. One preferred type of material is alumina, which has a peak in spectral absorptivity at about 10 microns that corresponds to the wavelength of a $CO_2$ laser.

Figure 2:
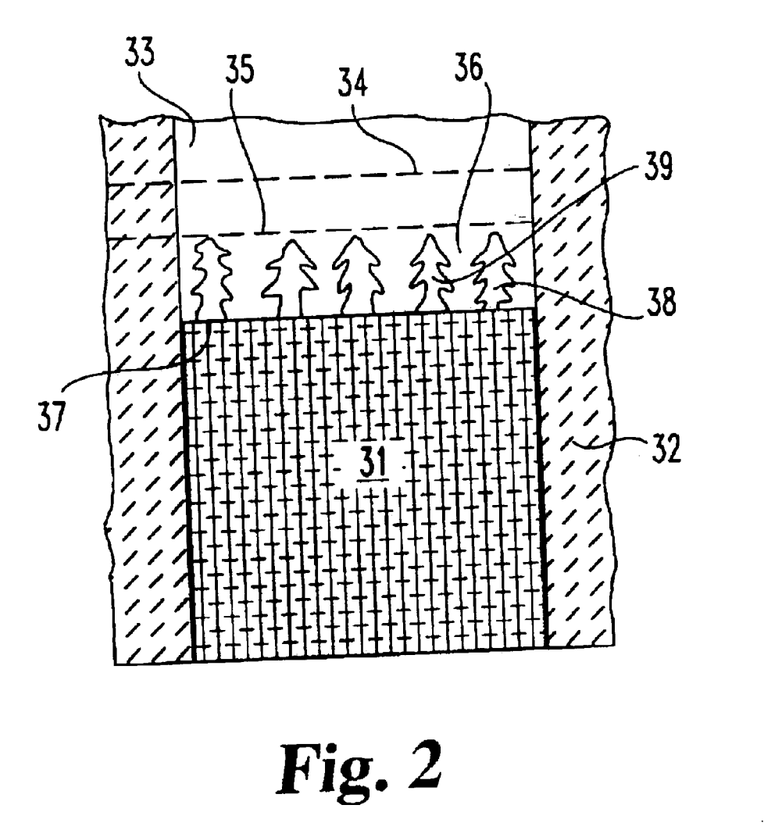
FIG. 2 is an illustration of the growth of dendrites from a starter seed.

With reference to FIG. 2, there is illustrated the controlled solidification of molten metal from a starter seed 31. While the controlled solidification described in FIG. 2 utilizes a starter seed it is fully contemplated herein that the process can also be one that does not utilize a starter seed and instead uses thermal and geometric (e.g. a pigtail) means. The controlled solidification of the molten metal is preferably used to produce products having a columnar grain or a single crystal microstructure. More specifically, the controlled solidification is utilized to solidify the molten metal into a component having the desired microstructure. Directional solidification involves moving a solidification interface progressively through a casting mold 32 filled with molten metal. In many circumstances, the metallic starter seed 31 is used to impart strictly oriented crystallographic structure to the crystal being grown. The metallic starter seed 31 is placed within the casting mold 32 and the introduction of the molten metal 33 into the mold 32 causes the starter seed to melt back from an original surface 34 to a surface defined as the liquidus interface 35. In one form of the present invention, the melt back of the starter seed forms a puddle of liquid molten metal from the starter seed. In one embodiment the depth of the puddle is about 0.050 inches, however other puddle depths are contemplated herein. A solidification zone 36 is positioned between the liquidus interface 35 and a solidus interface 37. As the thermal gradient moves vertically through the molten metal 33 in the mold 32, the material solidifies through the growth of dendrites 38 and the solidification of the matrix material. In a single crystal process the molten material solidifies epitaxially from the unmelted portion of the seed 31.

The solidification of the molten metal into a directionally solidified or single crystal casting relies upon the maintenance of a temperature gradient within the molten metal in order to drive the crystallographic growth. In general increasing the temperature gradient at the solidification interface 36 allows faster solidification rates, greater compositional homogeneity, and decreased primary dendrite arm spacing, all of which increase the quality of the final casting. Further, the present invention also contemplates the ability to control the order of solidification of the molten metal, which can help control casting shrink. Further, the present invention contemplates that multiple parts can be solidified from a single starter seed.

Figure 3:
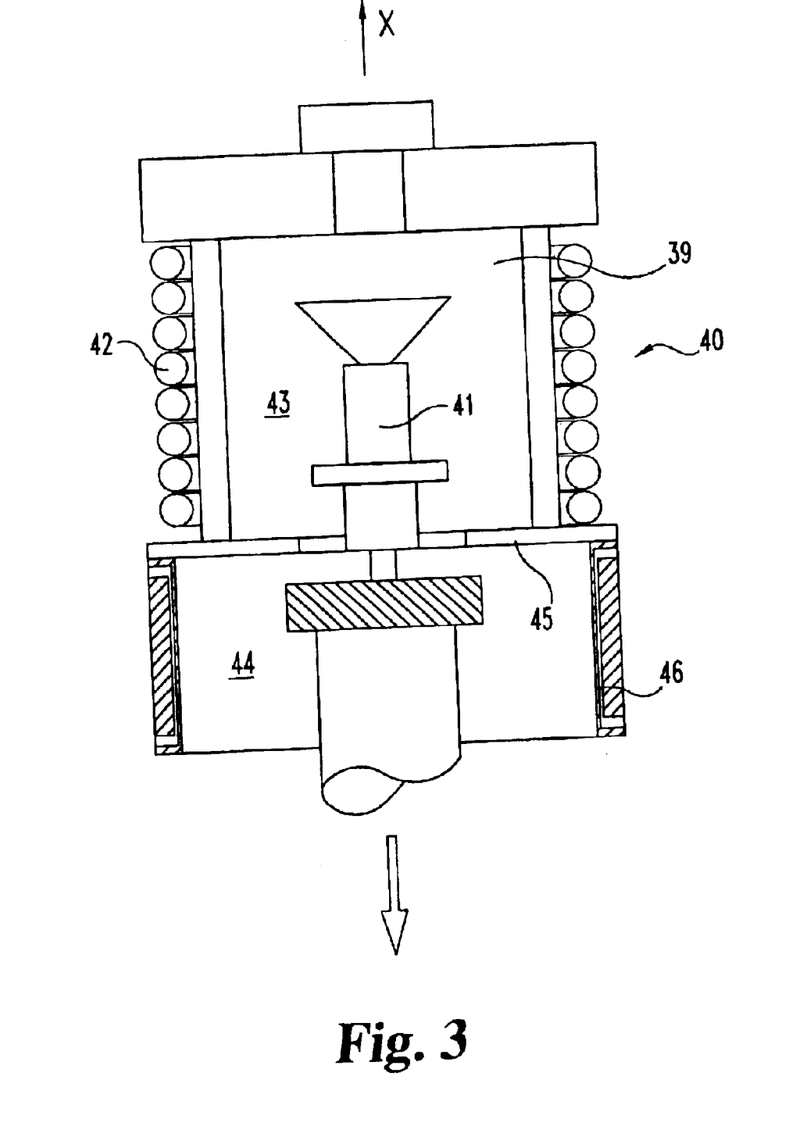
FIG. 3 is an illustration of a prior art system utilized for unidirectional casting techniques.

With reference to FIG. 3, there is illustrated a conventional system 40 for solidifying a molten metal into a single crystal or directionally solidified casting. The molten metal is poured into the mold 41. An induction mold heater 42 is disposed around and functions to impart energy to the mold 41. The interior volume of chamber 39 defines a hot zone 43 that is separated from a cold zone 44 by a baffle 45. A thermal gradient is established between the zones by the insulating baffle 45, which is located at the interface between the hot zone 43 and the cold zone 44. Heat is added to the hot zone 43 by the induction mold heater 42 and the heat sink 46 functions to remove thermal energy from the cold zone 44. Upon withdrawal of the casting mold 41 from the hot zone 43 into the cold zone 44 a thermal gradient passes through the solidifying metal within the mold. The thermal gradient is along the longitudinal axis Z and causes the formation of a directionally solidified or single crystal microstructure.

Figure 4:
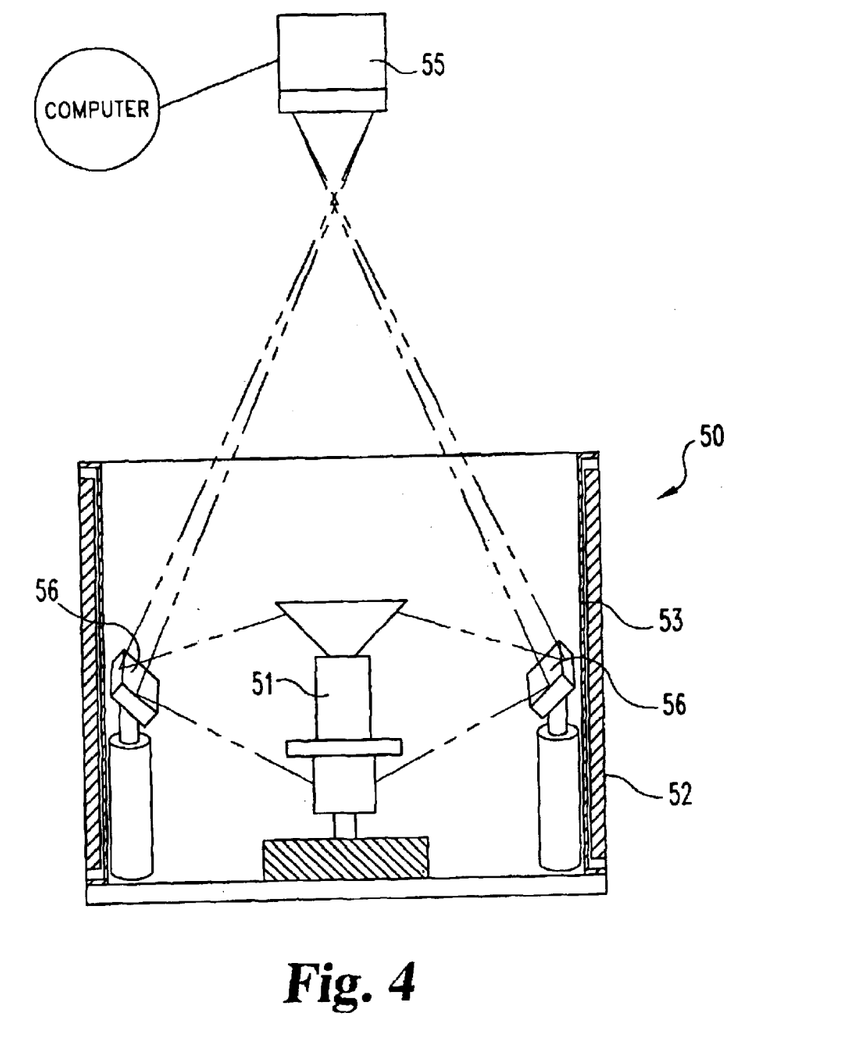
FIG. 4 is a schematic representation of a focused energy delivery system comprising one embodiment of the present invention.

With reference to FIG. 4, there is illustrated one embodiment of a molten metal solidification system 50 of the present invention. In one form of the present invention a focused energy source is used to add heat during solidification to overcome heat transfer losses to cold chamber walls 52 in the regions not yet solidified. In this way, the location of the solidification interface can be precisely controlled. Mold 51 is filled with molten metal and located within a temperature-controlled chamber 52. In one form the temperature-controlled chamber is a vacuum chamber, and preferably the vacuum within the chamber is less than about 150 milli-torr, and more preferably is within a range of about one milli-torr to about one hundred milli-torr. However, it is contemplated herein that the temperature controlled chamber could also have other levels of vacuum and the pressure within the chamber could also be at or above atmospheric pressure. The temperature-controlled chamber 52 includes a radiation heat sink 53 that is operational for removing thermal energy from the chamber 52 and more particularly from the mold 51. In one form of the present invention, the chamber walls are controlled with water cooling to less than 100 C. Prior to pouring the molten metal into the mold, the focused energy source is used to preheat the mold to above the melting temperature of the alloy (in the range of about 1400° C. to 1600° C.). However, the present application contemplates other temperatures as appropriate for the material being processed and in order to obtain the desired microstructure. The temperature controlled chamber 52 functions to cool the molten metal in the mold 51 and thereby solidify the molten metal into a cast structure.

As discussed previously it is necessary to maintain a thermal gradient moving through the molten metal in order to form a directionally solidified or single crystal microstructure. In a preferred embodiment the thermal gradient is defined by a sharp hot/cold temperature gradient at the solidification interface. A focused energy source 55 delivers energy to the mold 51 and/or metal within the mold at the desired location to maintain some portion of the metal at a temperature above the solidification temperature. In a preferred form of the present invention, the focused energy source comprises a laser (either focused or un-focused). The present invention contemplates the utilization of at least one laser, and more preferably a high powered infrared laser. The laser would preferably have power of about 0.5 KW to about 12 KW, and more preferably is a $CO_2$ infrared laser with a wavelength within a range of about 9 $\mu$m to about 11.8 $\mu$m. However, other types of lasers and/or levels of power are contemplated herein. The number of lasers or split laser beams utilized is preferably within a range of about one to about four lasers, however other quantities are contemplated herein. Factors that may influence the number of lasers utilized in the system include, but are not limited to, the configuration of the temperature-controlled chamber 52 and the geometry of the mold 51 to be heated. In alternate embodiments of the present invention it is contemplated that the focused energy source is an electron beam and/or a focused quartz heater and/or a focused plasma powered lamp. The present invention is not intended to be limited to these energy sources and other energy sources are contemplated herein. While the present invention will generally be described with the focused energy source being a laser it is intended to be applicable to other focused energy sources unless specifically provided to the contrary.

The utilization of a laser provides the ability to sharply define where energy is delivered and where energy is not delivered to the mold 51 and/or the metal therein, thereby, providing a thermal gradient appropriate for formation of single crystal or directionally solidified microstructures. In addition to the enhanced control of the solidification the present invention can be utilized to control the order of solidification. In one form of single crystal processing the solidification interface is moved substantially horizontally through a platform in the airfoil component before continuing to solidify vertically. The ability to control the order of solidification is applicable to a wide variety of components and types of microstructure.

The laser beam is directed to the mold 51 and is adapted to impart energy to the mold and/or metal within the mold. In one embodiment a pair of scanning reflectors 56 are controlled to deliver the energy beam from the laser 55 to the mold 51. The present invention contemplates the utilization of a plurality of reflectors and is not limited to just a pair of reflectors. More preferably, the scanning reflectors are mirrors that raster the area very rapidly. The movement of the laser beam can function to create a substantially continuous heating of the desired portion of the mold. The energy beams are moved across the mold in a predetermined pattern to create a thermal gradient at the solidification interface, and to control the movement of that solidification interface throughout the casting. This addition of energy creates the temperature gradient between the solidified and molten metal within the mold. It should be understood that the addition of energy can move progressively through the part or be delivered to one or more localized cooled area. In both situations the addition of energy is creating and/or enhancing the temperature gradient and facilitating crystal growth. The freedom of movement of the laser beam allows for the utilization of innovative solidification patterns in more complex geometric configurations.

In a preferred form of the present invention the wavelength of the laser beam can be selected to transfer energy to the mold and or the metal within the mold. Further, multiple lasers with different wavelengths can be utilized and directed to act on different portions of the mold and molten metal. In one form of the present invention the wavelength of the laser beam is tuned to transfer energy to the mold 51. In another form, the laser could be tuned to a wavelength to which the mold is substantially transparent to the beam and thereby allows the energy to be coupled directly to the molten metal.

With reference to the molten metal solidification system 50 set forth in FIG. 4, the mold 51 is not subject to a withdrawal-based solidification. The term withdrawal-based solidification generally refers to the axial withdrawal of the mold from the hot environment in order to create a thermal gradient. The focused energy source is the means for controlling solidification, grain and/or crystal orientation. In an alternate embodiment illustrated in FIG. 5, the focused energy source is utilized with a withdrawal-based solidification process to further control solidification, grain and/or crystal orientation. Further, the present invention also contemplates the utilization of the focused energy techniques of the present invention in other casting and solidification processes besides directionally solidified and single crystal processes, for example to control casting shrink (enhance fill) in equiaxed or other castings. The energy is applied to predetermined portions of the mold thereby allowing the molten metal to continue flowing as solidification shrinkage occurs. This additional energy will keep the metal liquid and control the contraction from liquid to solid in order to manage shrinkage. The selective addition of energy is also contemplated as a method to control the solidification of various aspects of the metallic component. This enables some control of grain size and can be used to control cracking in some material associated with high cooling rates.

Figure 5:
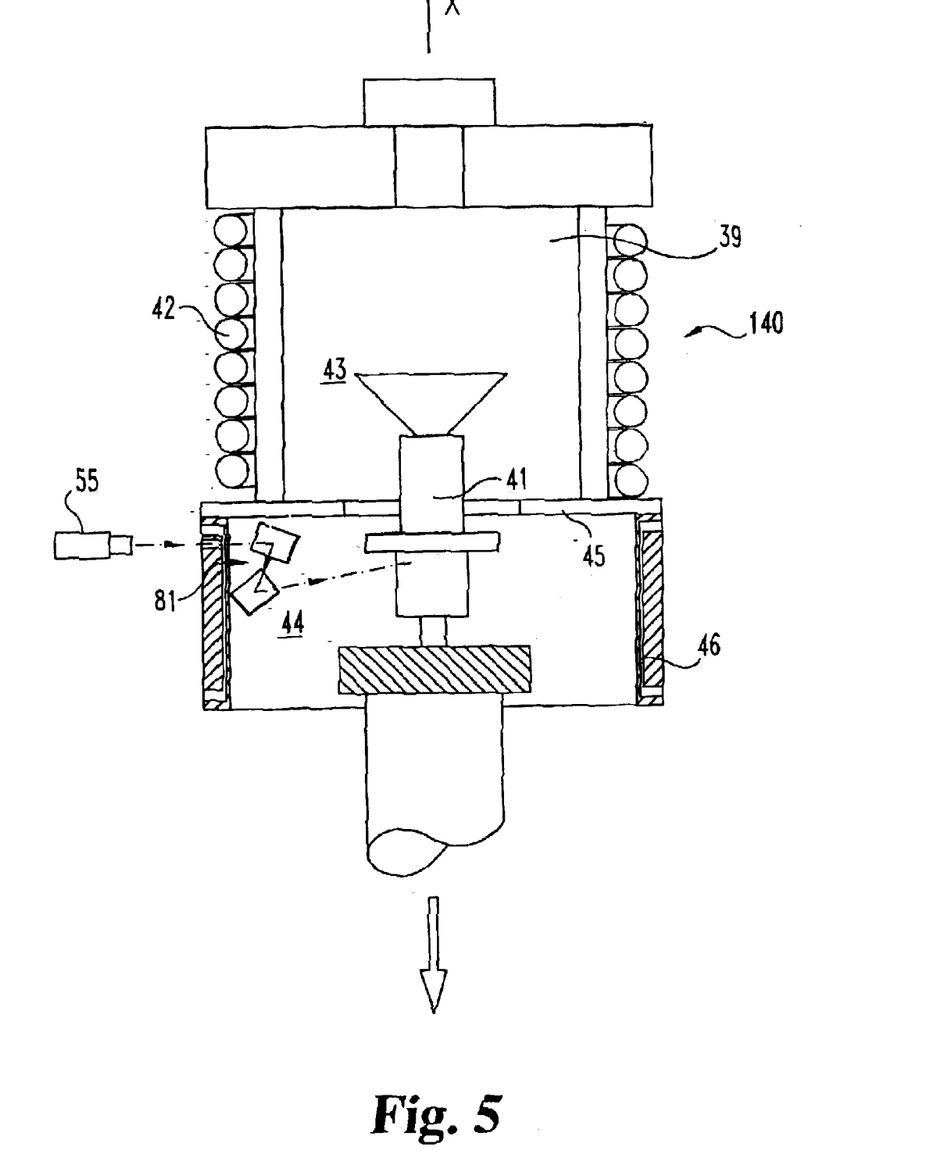
FIG. 5 is a schematic representation of one embodiment of a molten metal solidification system comprising withdrawal techniques and a focused energy system.

With reference to FIG. 5, there is illustrated a molten metal solidification system 140 for solidifying the molten metal into a single crystal or directionally solidified casting. The molten metal is poured into the mold 41. The induction mold heater 42 is disposed around and functions to impart energy to the mold 41. The interior volume of chamber 39 defines a hot zone 43 that is separated from a cold zone 44 by a baffle 45. A thermal gradient is established between the zones by the insulating baffle 45, which is located at the interface between the hot zone 43 and the cold zone 44. Heat is added to the hot zone 43 by the induction mold heater 42 and the heat sink 46 functions to remove thermal energy from the cold zone. Upon withdrawal of the casting mold 41 from the hot zone 43 into the cold zone 44 a thermal gradient passes through the solidifying metal within the mold. Focused energy source 55 delivers energy to the mold and/or metal within the mold at the desired location to maintain at least a portion of the metal at a temperature above the solidification temperature. In one form the focused energy source is a laser that has it's laser beam directed through a system 81 wherein the beam is controlled/directed to contact the mold. The previous description regarding focused energy sources is equally applicable to system 140 that utilizes a withdrawal based solidification system.

In one form of the present invention the focused energy rasters the hot mold section to maintain desired mold or metal temperatures. A computer-controlled laser rastering system may be used whereby it is programmed to match the component's geometry to the energy input. In operation molten metal is delivered into a casting mold for solidification into a predetermined shape. The focused energy system provides energy at select locations to the mold and/or molten metal to control the solidification of the molten metal and/or the order of solidification of the molten metal. The focused energy is moved to select locations associated with the mold to maintain a thermal gradient necessary to obtain the desired crystal structure. The progression of the thermal gradient through the mold can proceed in an axial direction or in other directions as required to obtain the necessary microstructure. In one embodiment of the present invention related to the processing of a single crystal there is manifested a very high thermal gradient that is moved across the component in a controlled fashion.

The present invention is further described in detail by means of the following Examples and Comparisons. All parts and percentages are by weight and all temperatures are degrees Celsius unless explicitly stated otherwise.

EXAMPLES

Example 1

Laser-Assisted Solidification:

Objective: Solidification of thin-walled turbine blade casting could be assisted using a combination of withdrawal (physically moving the mold from a hot zone, through an insulated baffle, to a cold zone) and a rastered laser beam just above the solidification interface to achieve a sharper temperature gradient at the solidification interface than could be achieved by the baffle alone.

Furnace Configuration could be either with or without a separate mold heater. The hot zone could be heated with surrounding resistance heater that radiates heat to the mold. A crucible full of molten metal would be above hot zone. The furnace could also have any standard method of delivering molten metal to mold.

Particulars: CMSX-4 nickel-based superalloy (melting temperature 1270 to 1360), final casting to be SX $1^{st}$-stage turbine blade for a jet aircraft engine could be made. Final blade is about 4" tall, 2" wide with integral cooling features and thin walls (approximately 0.040" thick). An aluminia mold for this blade is made using ceramic stereolithography with mold walls about 0.080" thick. Mold is poured root-up for best fill, and to be solidified vertically from tip to root. Either a pigtail or a seed is inserted into the bottom of the mold to initiate the single-crystal grain structure. Mold can be inserted into a conventional investment casting pouring tree or cast as a single mold connected to the furnace withdrawal.

Laser: 500 W $CO_2$ laser from Coherent (model K500), split into two beams, one on either side of the mold, could be used. These incoming laser beams are located just below baffle, and are rastered using programmable scanning mirrors. The laser power is programmed to maximize temperature gradient solidification interface. The laser has been programmed using a solid metal model of the mold to raster across the mold just below the baffle, and scans a longitudinal section approximately ½" long (just long enough to insure a sharp temperature gradient, and in this case, the beam diameter of the laser). The laser power and number of split laser beams has been mathematically and experimentally determined for this mold geometry, furnace configuration, alloy, and the like. The incident laser power is set such that the solidification interface is just below the lower rastering line of the laser.

Laser-Assisted Solidification Process:

1. Preheat mold to above melting temperature of alloy (approximately 1500 C) using any type of mold heater inside furnace (e.g. quartz), or using a rastered laser beam. Insure mold is sufficiently hot to allow molten metal to fill even small areas.

2. Pour molten metal into the mold.

3. Start to slowly withdraw mold from hot zone through baffle into cold zone.

4. Solidification starts at pigtail and continues up the part as the mold is withdrawn at a rate approximately 0.15 in/min.

5. Laser scanning starts at bottom of mold.

Example 2

Laser Solidification without Withdrawal

The same equipment and procedure as Example 1 could be followed, except the mold heater is not used to keep the hot zone hot during solidification. The laser is used to keep the entire hot section of the mold hot (and hence the metal in this section molten) until the solidification interface moves up the mold. In the beginning of solidification, the laser is scanned over the whole mold from the bottom to the top. After filling, the mold is radiating to cold chamber walls. The lowest rastering point is gradually moved up the mold to allow the solidification interface to move up the mold.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A method for the production of a cast component comprising the steps of:
   1) providing a molten metal mass in a casting mold and exposing the casting mold to a cooling environment thereby creating a solidification interface between molten metal regions and solidified metal regions, and
   2) applying focused energy from at least one focused energy source to a portion of the filled casting mold to control a temperature gradient near the solidification interface, said at least one focused energy source is located outside of the molten metal mass.

2. The method of claim 1 wherein the cast component is a thin-walled single crystal structure.

3. The method of claim 1 wherein the cast component is a gas turbine engine blade.

4. The method of claim 1 wherein the molten metal is selected from the group consisting of alloys, superalloys, elemental metals, refractory metals, and intermetallic metals.

5. The method of claim 1 wherein the molten metal is a superalloy containing a mixture of nickel, chromium, and aluminum.

6. The method of claim 1 wherein the focused energy source is a laser.

7. The method of claim 6 wherein the laser is a $CO_2$ infrared laser.

8. The method of claim 1 wherein the mold material is a transmissive mold material.

9. The method of claim 1 wherein the mold material is an absorptive mold material.

10. The method of claim 1 wherein the mold material is alumina.

11. The method of claim 1 wherein the mold is located within a temperature-controlled chamber.

12. The method of claim 1 wherein the temperature-controlled chamber is a vacuum chamber having a vacuum of less than about 150 milli-torr.

13. A method for controlling solidification of a molten metal mass in a casting mold, comprising the steps of:
   1) providing a molten metal mass in a casting mold and exposing the casting mold to a cooling environment, thereby creating a solidification interface between molten metal regions;
   2) applying focused energy from at least one focused energy source to a portion of the filled casting mold to control a temperature gradient in the molten metal region located proximately near the interface, said at least one focused energy source located outside the molten metal mass; and
   3) rastering or scanning that focused energy source across the portion of the filled mold intended to stay molten to control the order of solidification thereby controlling casting shrink or controlling the rate of solidification, thereby controlling grain structure in the final casting.

14. The method of claim 13 wherein at least one solid metal starter seed is introduced into the casting mold before step 1), each solid metal starter seed used to impart a strictly oriented, single crystal microstructure to the solidified cast component being made.

* * * * *